(12) United States Patent
Schoy

(10) Patent No.: US 6,349,049 B1
(45) Date of Patent: Feb. 19, 2002

(54) HIGH SPEED LOW POWER CONTENT ADDRESSABLE MEMORY

(75) Inventor: Albrecht Schoy, Cupertino, CA (US)

(73) Assignee: Sun Microsystems, Inc., Palo Alto, CA (US)

( * ) Notice: Subject to any disclaimer, the term of this patent is extended or adjusted under 35 U.S.C. 154(b) by 0 days.

(21) Appl. No.: 09/815,227

(22) Filed: Mar. 22, 2001

(51) Int. Cl.$^7$ ............................................... G11C 15/00

(52) U.S. Cl. .......................................... 365/49; 365/203

(58) Field of Search ...................... 365/49, 203, 230.03

(56) References Cited

U.S. PATENT DOCUMENTS 6,170,891 B1 * 11/2000 Nataraj ......................... 365/49
6,195,278 B1 * 2/2001 Catlin et al. ............ 365/189.07
6,243,280 B1 * 5/2001 Wong et al. ................... 365/49

OTHER PUBLICATIONS

K. Schultz et al, "Fully–Parallel 25 MHz 2.5 Mb CAM," IEEE 1998 SA 21.1–21.12.

* cited by examiner

Primary Examiner—Vu A. Le
(74) Attorney, Agent, or Firm—William L Paradice, III

(57) ABSTRACT

One or more boost circuits are included within each row of CAM cells to increase the charging rate of its match line during match conditions. The CAM cells in each row control corresponding match transistors connected in series between a supply voltage and a match line. The match transistors collectively form a NAND match circuit. A boost circuit connected between a supply voltage and ground potential is coupled to a midpoint of the NAND match transistor chain. During compare operations, if all CAM cells match, all match transistors turn on and pull the match line toward the supply voltage. As the voltage at the midpoint of the match line reaches a threshold voltage, the boost circuit provides an additional charging path to more quickly charge the match line. If any CAM cell mismatches, its match transistor turns off and isolates the match line from the supply voltage.

13 Claims, 6 Drawing Sheets

HIGH SPEED LOW POWER CONTENT ADDRESSABLE MEMORY

BACKGROUND

1. Field of Invention

This invention relates generally to semiconductor memory devices and specifically to a content addressable memory.

2. Description of Related Art

A CAM includes an array of memory cells arranged in a matrix of rows and columns. Each memory cell stores a single bit of digital information, i.e., either logic zero or logic one. The bits stored within a row of memory cells constitute a CAM word. During compare operations, a comparand word is received at appropriate input terminals of a CAM device and driven into the CAM array using compare lines to be compared with all the CAM words in the device. For each CAM word that matches the comparand word, a corresponding match line signal is asserted to indicate a match condition. If the comparand word matches more than one of the CAM words, the match line corresponding to each of the matching CAM words is asserted, and a "multiple match" flag is also asserted to indicate the multiple match condition. The match line signals from each CAM word are combined in a priority encoder to determine the index or address of the highest-priority matching CAM word.

In early CAM architectures, the match result for each CAM word is determined by a dynamic NOR of individual bit comparison results for that row. For example, in a dynamic NOR match circuit, each CAM cell controls a corresponding match transistor connected in parallel between the match line and ground potential. Prior to a compare operation, the match line is typically pre-charged to a supply voltage (e.g., $V_{DD}$). During the compare operation, a comparand word is compared to data stored in each row. For any given row, if any of the individual bit comparisons produce a mismatch condition, the match transistor of the corresponding CAM cell turns on and discharges the match line to ground potential to indicate the mismatch condition. Conversely, if all CAM cells in a row produce a match condition, the match transistors do not turn on, and thus the match line remains charged (e.g., at $V_{DD}$). Since each match line is discharged in response to a mismatch condition, CAM architectures having a dynamic NOR match circuit incur two match line transitions (e.g., one to pre-charge and another to discharge) per mismatched word per compare operation. Accordingly, dynamic NOR match circuits typically have excessive power dissipation, since no more than one match is typically expected per compare operation.

To reduce such power dissipation, the dynamic NOR match circuit may be replaced by a dynamic NAND match circuit, where the match transistors of CAM cells in each row are connected in series between the supply voltage and the match line. Prior to a compare operation, the match line is typically discharged (e.g., to ground potential). During the compare operation, if all of the individual bit comparisons produce a match, all the match transistors turn on and pull or charge the match line toward the supply voltage to indicate the match condition. Conversely, if any of the individual bit comparisons produce a mismatch condition, the match transistor of the corresponding mismatching CAM cell does not turn on, thereby preventing the match line from charging toward the supply voltage. Accordingly, since there is typically only one matching row per compare operation, only one match line is typically charged toward the supply voltage per compare operation, thereby reducing power dissipation over NOR match circuits.

However, because of a phenomena commonly known as the body effect, stacked NAND structures such as NAND match circuits are typically slower than NOR structures. Further, parasitic capacitances associated with the series-connected match transistors of dynamic NAND match circuits may result in significant loading which, in turn, undesirably slows the charging of the match line. Accordingly, there is a need to improve the speed of NAND match detection circuits.

SUMMARY

A CAM architecture is disclosed that may increase performance over conventional CAM devices. In accordance with the present invention, one or more boost circuits are included within each row of CAM cells to increase the charging rate of its match line during match conditions. The CAM cells in each row control corresponding match transistors connected in series between a supply voltage and a match line. The match transistors collectively form a NAND match circuit. A boost circuit having power terminals connected to the supply voltage and to ground potential is coupled to a midpoint of the NAND match transistor chain. Prior to compare operations, the match line may be discharged using the boost circuit. During compare operations, each match transistor turns on if there is a match in the corresponding CAM cell. If all CAM cells match, all match transistors turn on and pull the match line toward the supply voltage. As the voltage at the midpoint of the match line reaches a threshold, the boost circuit provides an additional charging path for the match line to more quickly charge the match line during the match condition. In this manner, the boost circuit increases the speed with which the match conditions propagate along the NAND match transistor chain. Conversely, if any CAM cell mismatches, its match transistor turns off and isolates the match line from the supply voltage, thereby forcing the match line to remain in its discharged state.

In one embodiment, each CAM row includes a plurality of first and second CAM cells and associated first and second boost circuits. Each CAM cell has a match node coupled to the gate of a corresponding match transistor. The match transistors corresponding to the first CAM cells are connected in series between the supply voltage via an evaluate transistor and a first node, to which the first boost circuit is also coupled. The match transistors corresponding to the second CAM cells are connected in series between the first node and a second node, to which the second boost circuit and match line are also coupled. If there is a match condition in all the first CAM cells, the first boost circuit turns on and quickly charges the first node to the supply voltage. If there is also a match condition in all the second CAM cells, the second boost circuit turns on and quickly charges the match line to the supply voltage to indicate the match condition. In this manner, the first and second boost circuits increase the charging rate of the match line when there is a match condition.

BRIEF DESCRIPTION OF THE DRAWINGS

Like reference numerals refer to corresponding parts throughout the drawing figures.

DETAILED DESCRIPTION

Embodiments of the present invention are discussed below in the context of a CAM architecture 100 for simplicity only. It is to be understood that embodiments of the present invention are equally applicable to CAM architectures having other configurations. Further, the logic levels assigned to various signals in the description below are arbitrary, and therefore may be modified (e.g., reversed polarity) as desired. Accordingly, the present invention is not to be construed as limited to specific examples described herein but rather includes within its scope all embodiments defined by the appended claims.

Figure 1:
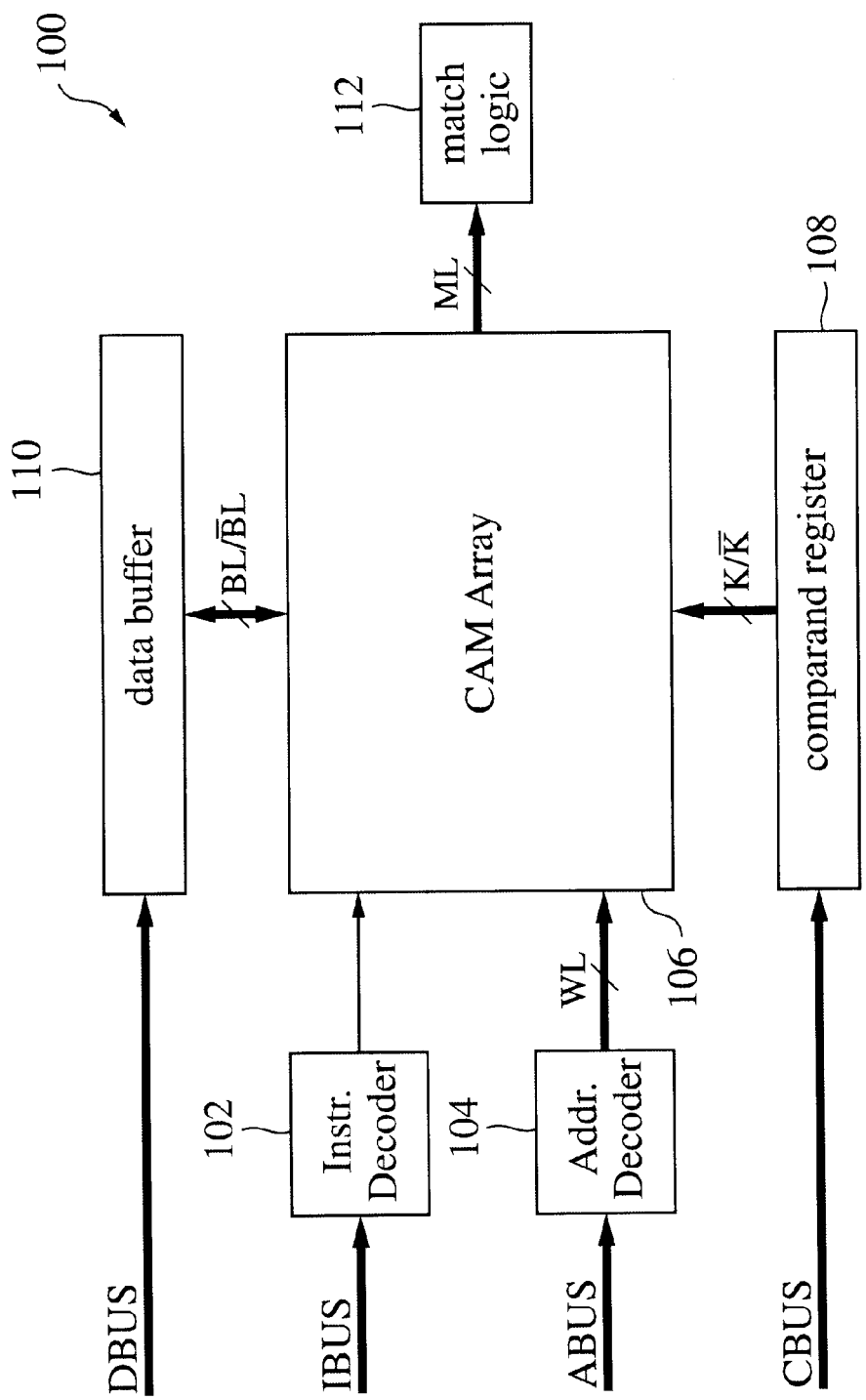
FIG. 1 is a block diagram of a CAM architecture within which embodiments of the present invention may be implemented.

FIG. 1 shows a CAM architecture 100 in which embodiments of the present invention may be implemented, and includes an instruction decoder 102, an address decoder 104, a CAM array 106, a comparand register 108, a data buffer 110, and match logic 112. Instruction decoder 102 decodes instructions received from an instruction bus IBUS and, in response thereto, provides control signals to CAM array 106 to facilitate read, write, and compare operations. CAM architecture 100 may be a synchronous architecture that loads instructions into instruction decoder 102 in response to a clock signal CLK (not shown for simplicity). For other embodiments, CAM architecture 100 may be asynchronous. CAM array 106 includes a plurality of CAM cells arranged in rows and columns. During read and write operations, address decoder 104 decodes an address from an address bus ABUS and, in response thereto, selects a row for the operation by asserting a corresponding word line WL. Data may be read from or written to the selected row in CAM array 106 using data buffer 110 and complementary bit lines BL and $\overline{BL}$ in a conventional manner. Data buffer 110 is accessed using a data bus DBUS.

During a compare operation, a comparand word to be compared with data words stored in corresponding rows of CAM array 106 is received into comparand register 108 from a comparand bus CBUS, and thereafter provided to CAM array 106 via complementary compare lines K and $\overline{K}$. One or more bits of the comparand word may be globally masked by mask data stored in one or more registers (not shown), or locally masked, in a conventional manner. During the compare operation, each row of CAM array 106 provides a match signal to match logic 112 via a corresponding match line ML to indicate whether a match condition exists for the row. Match logic 112 may output one or more flag signals including a single match flag and a multiple match flag in response to match conditions received from CAM array 106. The match lines ML may also be provided to an encoder such as a priority encoder (not shown) to provide, for instance, the address of the highest-priority matching row. For simplicity, the word lines WL, match lines ML, complementary compare lines K and $\overline{K}$, and complementary bit lines BL and $\overline{BL}$ are represented collectively in FIG. 1. In some embodiments, the comparand register 108 and data buffer 110 may share components or each form part of a single buffer circuit. In other embodiments, the compare lines and comparand register 108 may be omitted, and the comparand data may be provided to the CAM array 106 via the bit lines.

Figure 2:
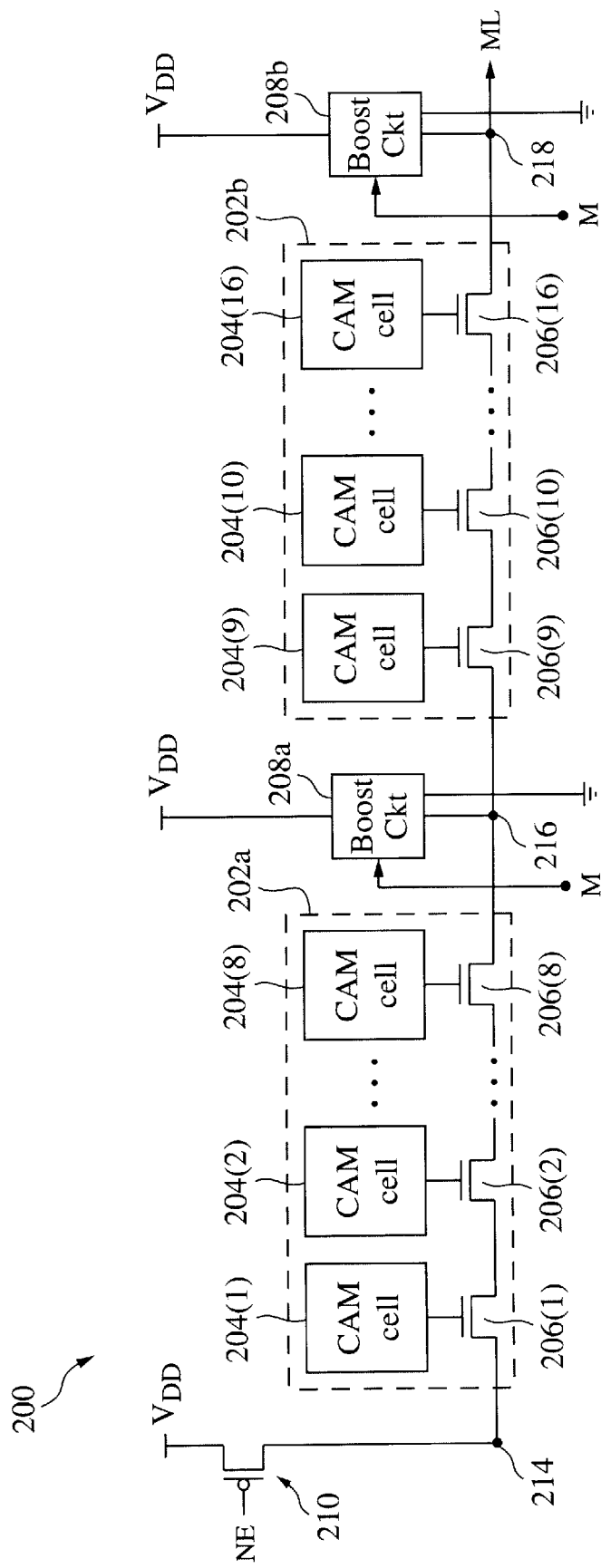
FIG. 2 is a block diagram of a CAM row in accordance with one embodiment of the present invention.

FIG. 2 shows a 16-bit row 200 in accordance with one embodiment of CAM architecture 100. Row 200 includes a first row segment 202a having eight CAM cells 204(1)–204(8), a second row segment 202b having eight CAM cells 204(9)–204(16), first and second boost circuits 208a and 208b, and a PMOS evaluate transistor 210. For simplicity, word lines, compare lines, and bit lines are omitted from FIG. 2. CAM cells 204(1)–204(16) have match nodes connected to the gates of match transistors 206(1)–206(16), respectively, which collectively form a NAND match transistor chain. Evaluate transistor 210 is connected between a supply voltage $V_{DD}$ and first row segment 202a, and has a gate coupled to receive an evaluate signal NE. Match transistors 206(1)–206(8) are connected in series between evaluate transistor 210 and node 216, to which first boost circuit 208a is also coupled. Match transistors 206(9)–206(16) are connected in series between node 216 and node 218, to which second boost circuit 208b and the match line ML are also coupled. Boost circuits 208a and 208b each have power terminals coupled to $V_{DD}$ and to ground potential, and also include a control terminal coupled to receive a mode signal M. Match line ML indicates match conditions for row 200.

In actual embodiments, a buffer (not shown in FIG. 2 for simplicity) may be coupled at the end of the match line ML to provide the match line signal. In some embodiments, the buffer is an inverting buffer that provides a logic low signal when there is a match condition in the row and provides a logic high signal when there is a mismatch condition in the row.

Prior to compare operations, evaluate signal NE is de-asserted (e.g., to logic high) to turn off PMOS evaluate transistor 210 and thereby isolate node 214 from $V_{DD}$. Appropriate comparand signals are provided to CAM cells 204(1)–204(16) so that all corresponding match transistors 206(1)–206(16) turn on. Mode signal M is driven to logic high, and in response thereto, boost circuits 208a and 208b discharge the match line ML to ground potential (e.g., logic low) to indicate the default mismatch condition.

For the compare operation, evaluate signal NE is asserted (e.g., to logic low) to turn on PMOS evaluate transistor 210, which in turn pulls node 214 toward $V_{DD}$ (e.g., to logic high). Bits of a comparand word are provided to corresponding CAM cells 204(1)–204(16) and compared with data bits stored therein. Mode signal M is driven to logic low, which causes boost circuits 208a and 208b to isolate match line ML from ground potential. For each CAM cell 204, if there is a match, the CAM cell asserts its match node to logic high, thereby turning on its corresponding match transistor 206. If all CAM cells 204(1)–204(16) match, all match transistors 206(1)–206(16) turn on and charge match line ML toward $V_{DD}$ through evaluate transistor 210. The resultant logic high state of match line ML indicates the match condition.

Conversely, if there is a mismatch in any CAM cell 204, its match node is de-asserted to logic low to turn off the corresponding match transistor 206, which in turn prevents match line ML from charging toward $V_{DD}$. The resultant logic low state of match line ML indicates the mismatch condition.

Boost circuits 208a and 208b improve performance by increasing the charging rate of match line ML during match conditions. In accordance with the present invention, if there is a match condition in first row segment 202a, match transistors 206(1)–206(8) conduct and charge node 216 toward $V_{DD}$ via evaluate transistor 210. When the voltage at node 216 reaches a threshold voltage $V_T$, boost circuit 208a turns on and helps charge the match line ML toward $V_{DD}$. Similarly, if there is also a match condition in the second row segment 202b, match transistors 206(9)–206(16) conduct and charge node 218 toward $V_{DD}$. When the voltage at node 218 reaches $V_T$, boost circuit 208b turns on and helps charge match line ML toward $V_{DD}$. By turning on to more quickly charge match line ML toward $V_{DD}$ during match conditions, boost circuits 208a and 208b may increase the speed with which the match condition propagates along the NAND match transistor chain, thereby improving performance. The value for $V_T$ may be adjusted as desired. For some embodiments, first and second boost circuits 208a and 208b may have different threshold voltages.

In some embodiments, the gate of evaluate transistor 210 is tied to ground potential so that evaluate transistor 210 remains in a conductive state. In one embodiment, the mode signal M and the evaluate signal NE are complementary signals.

Figure 3:
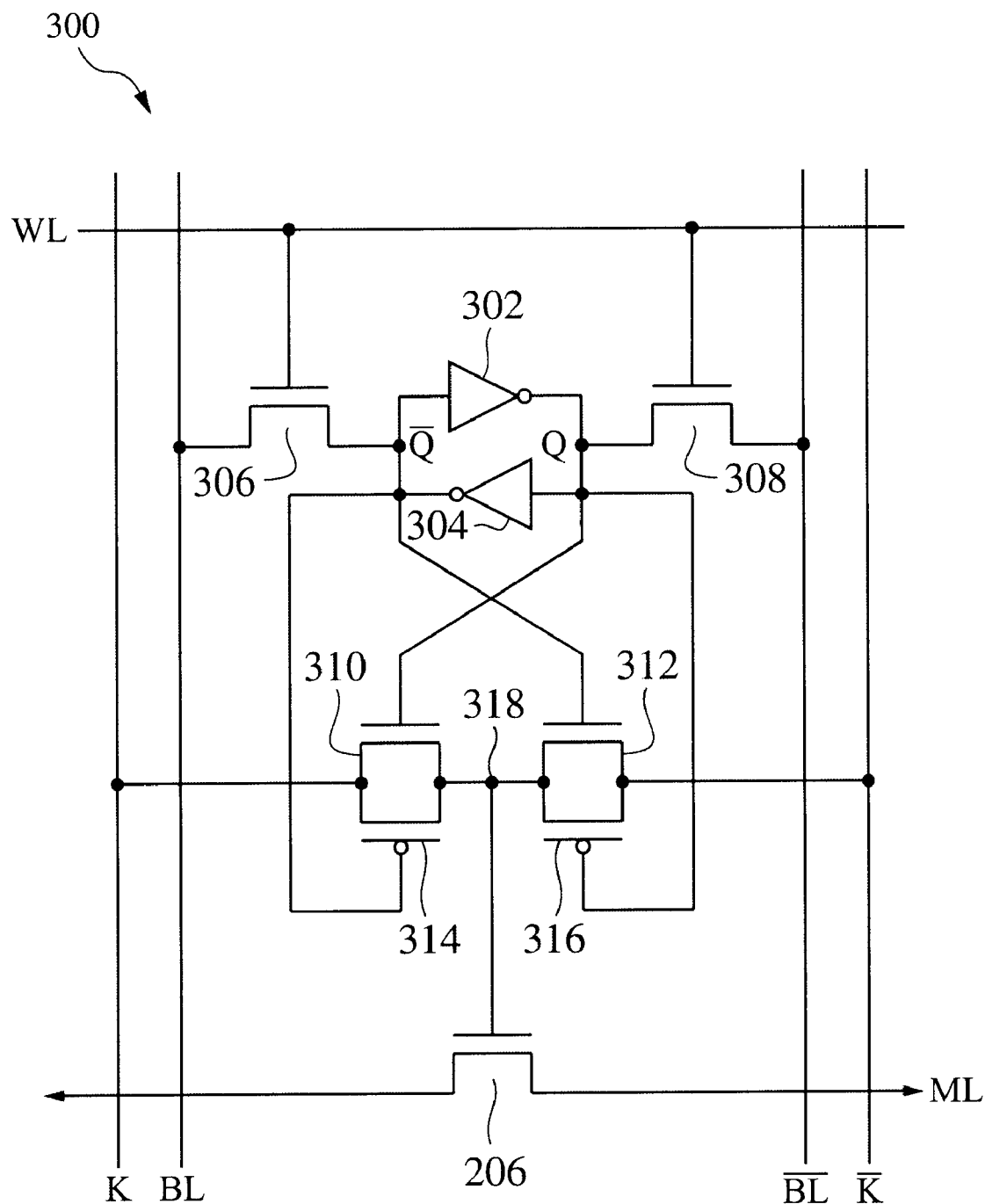
FIG. 3 is a circuit diagram of a CAM cell in accordance with one embodiment of the present invention.

CAM cells 204 may be any suitable CAM cells capable of providing to corresponding match transistors 206 a binary signal indicative of match results between corresponding data and comparand bits. FIG. 3 shows a CAM cell 300 that is one embodiment of CAM cells 204 of FIG. 2. CAM cell 300 includes a latch formed by inverters 302 and 304 for storing a data bit Q. Opposite sides of the latch are coupled to complementary bit lines BL and $\overline{BL}$ via access transistors 306 and 308, respectively, where each access transistor has a gate coupled to a word line WL. The output terminal of the inverter 302 provides the data bit Q to the gate of an NMOS compare transistor 310 coupled between compare line K and a match node 318. The output terminal of inverter 304 provides complementary data bit $\overline{Q}$ to the gate of an NMOS compare transistor 312 coupled between complementary compare line $\overline{K}$ and match node 318. The gate of match transistor 206 is controlled by match node 318.

The embodiment of FIG. 3 also includes PMOS compare transistors 314 and 316. PMOS compare transistor 314 is coupled in parallel with NMOS compare transistor 310 between compare line K and match node 318, and has a gate coupled to receive complementary data bit $\overline{Q}$. PMOS compare transistor 316 is coupled in parallel with NMOS compare transistor 312 between complementary compare line $\overline{K}$ and match node 318, and has a gate coupled to receive data bit Q. Together, compare transistors 310 and 314 form a first transmission gate having a full rail-to-rail swing, and may therefore provide the full voltage level of a logic high signal on compare line K to match node 318. Similarly, compare transistors 312 and 316 together form a second transmission gate having a full rail-to-rail swing, and may therefore provide the full voltage level of a logic high signal on complementary compare line $\overline{K}$ to match node 318. Maximizing the voltage level at match node 318 maximizes the speed with which match transistor 206 turns on to charge match line ML during match conditions.

Figure 4:
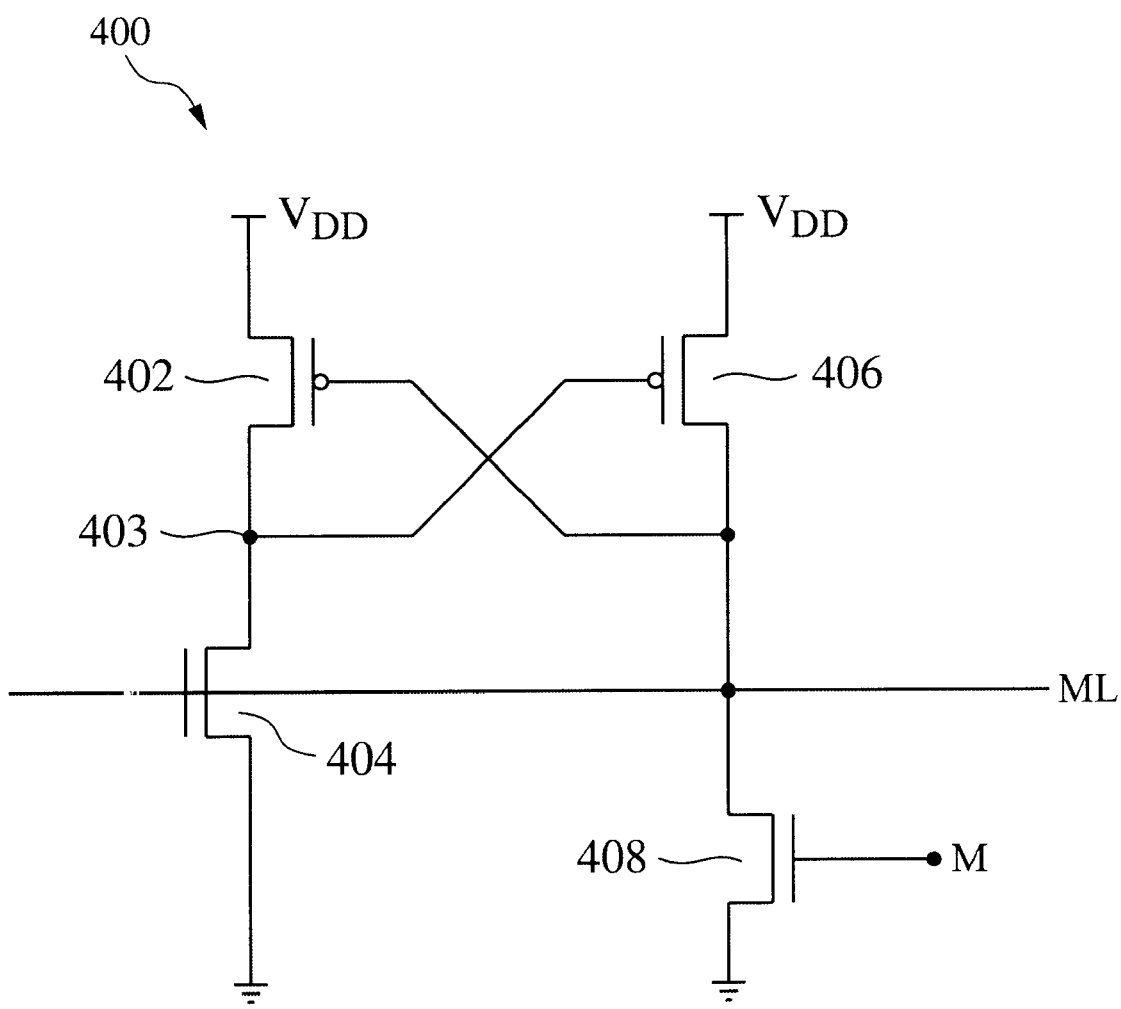
FIG. 4 is a circuit diagram of one embodiment of the boost circuit of FIG. 2.

FIG. 4 shows a boost circuit 400 that is one embodiment of boost circuits 208 of FIG. 2. Boost circuit 400 includes a PMOS transistor 402 connected between $V_{DD}$ and a node 403, and an NMOS transistor 404 connected between node 403 and ground potential. The gates of PMOS transistor 402 and NMOS transistor 404 are coupled to match line ML. A second PMOS transistor 406 is connected between $V_{DD}$ and match line ML, and has a gate connected to node 403. A second NMOS transistor 408 is connected between match line ML and ground potential, and has a gate coupled to receive mode signal M.

Referring to FIGS. 2–4, prior to compare operations, evaluate signal NE is de-asserted to turn off evaluate transistor 210. All complementary compare lines K and $\overline{K}$ are driven to logic high, e.g., to $V_{DD}$, so that regardless of the binary state of data Q stored in each CAM cell, either the first transmission gate formed by transistors 310 and 314, or the second transmission gate formed by transistors 312 and 316, will provide a logic high value of approximately $V_{DD}$ to the gate of its corresponding match transistor 206, thereby turning on all match transistors 206 in the row. A logic high mode signal M is provided to boost circuit 400 to turn on transistor 408, which in turn discharges match line ML to ground potential. The logic low state of match line ML turns off transistor 404 to isolate node 403 from ground potential, and also turns on transistor 402 to pull node 403 high toward $V_{DD}$. The high logic state at node 403 turns off transistor 406 to isolate match line ML from $V_{DD}$.

During compare operations, the word lines WL are grounded to turn off access transistors 306 and 308 within each CAM cell. Comparand bits are provided to the CAM cells via complementary compare lines K and $\overline{K}$. Evaluate signal NE is driven to logic low to turn on evaluate transistor 210, thereby charging node 214 to approximately $V_{DD}$. Mode signal M is driven to logic low to turn off transistor 408, and thereby isolate match line ML from ground potential. For each CAM cell, if there is a match, its corresponding match transistor 206 turns on. If all CAM cells have a match condition, all match transistors 206(1)–206(16) turn on and pull match line ML high toward $V_{DD}$. As the gate of transistor 404 charges beyond the threshold voltage $V_T$ of transistor 404, transistor 404 turns on and quickly discharges node 403 toward ground potential. In response thereto, transistor 406 turns on and rapidly charges match line ML high toward $V_{DD}$, thereby accelerating the propagation of the logic high match condition along the NAND match transistor chain. The logic high state of match line ML turns off transistor 402 to isolate node 403 from $V_{DD}$. Thus, during match conditions, boost circuits 208a and 208b act to increase the charging rate of match line ML. The additional current-carrying capacity of boost circuits 208a and 208b in charging match line ML may significantly increase the speed with which row 200 transitions its match line ML from logic low to logic high for match conditions.

If, on the other hand, any of the bit comparisons between CAM cells mismatch, one or more corresponding match transistors 206 will be in a non-conductive state, thereby preventing match line ML from being charged toward $V_{DD}$. In this state, the gate of transistor 404 remains in a discharged state, which in turn maintains transistor 404 in a non-conductive state. Node 403 remains in a logic high state, and thus transistor 406 remains non-conductive and isolates match line ML from $V_{DD}$. The resultant logic low signal on match line ML indicates the mismatch condition.

Figure 5:
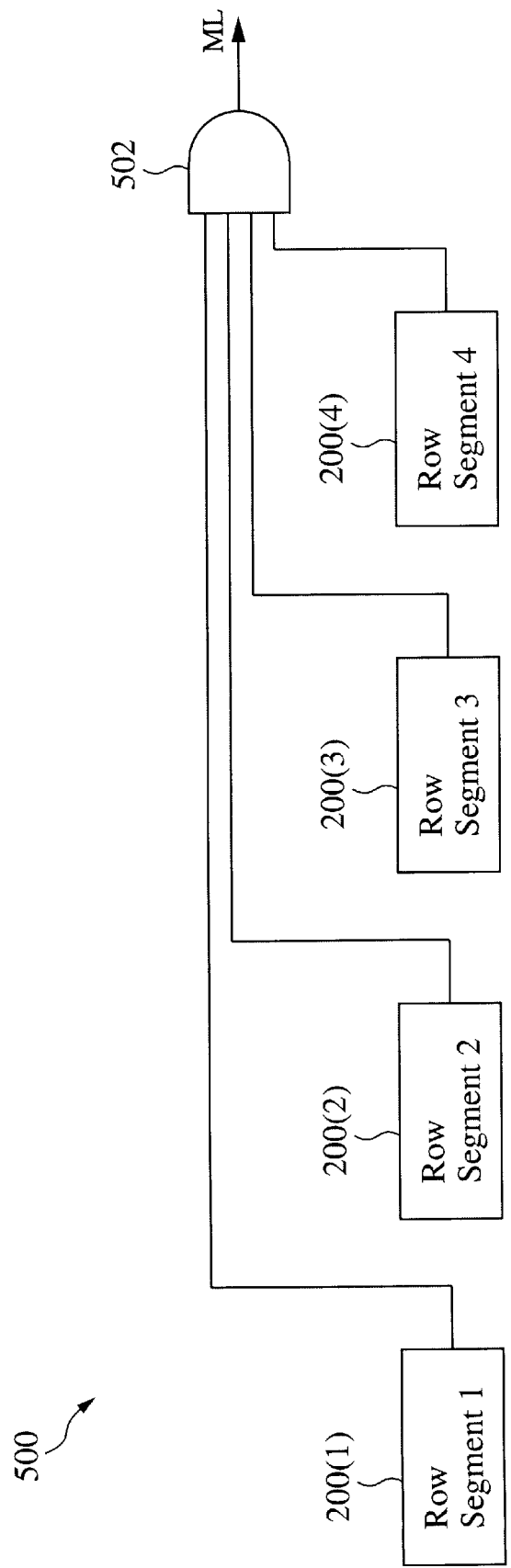
FIG. 5 is a block diagram of a CAM row including a plurality of the row segments of FIG. 2 in one embodiment of the present invention.

In one embodiment, four of the 16-bit rows 200 described above with respect to FIG. 2 are coupled together as shown in FIG. 5 to implement a 64-bit CAM row 500 in accordance with the present invention. Four CAM row segments 200(1)–200(4) provide match signals on match lines ML_1 to ML_4, respectively, to an AND gate 502. If all match signals on lines ML_1 to ML_4 are asserted to logic high, AND gate 502 asserts match line ML to logic high to indicate the match condition. If there is a mismatch in any row segment 200(1)–200(4), AND gate 502 de-asserts match line ML to logic low. The 64-bit CAM row 500 shown in FIG. 5 is useful for performing compare operations in 64-bit environments. Of course, in actual embodiments, row 500 may include any number of row segments 200 and, further, each row segment 200 may include any number of CAM cells.

Figure 6:
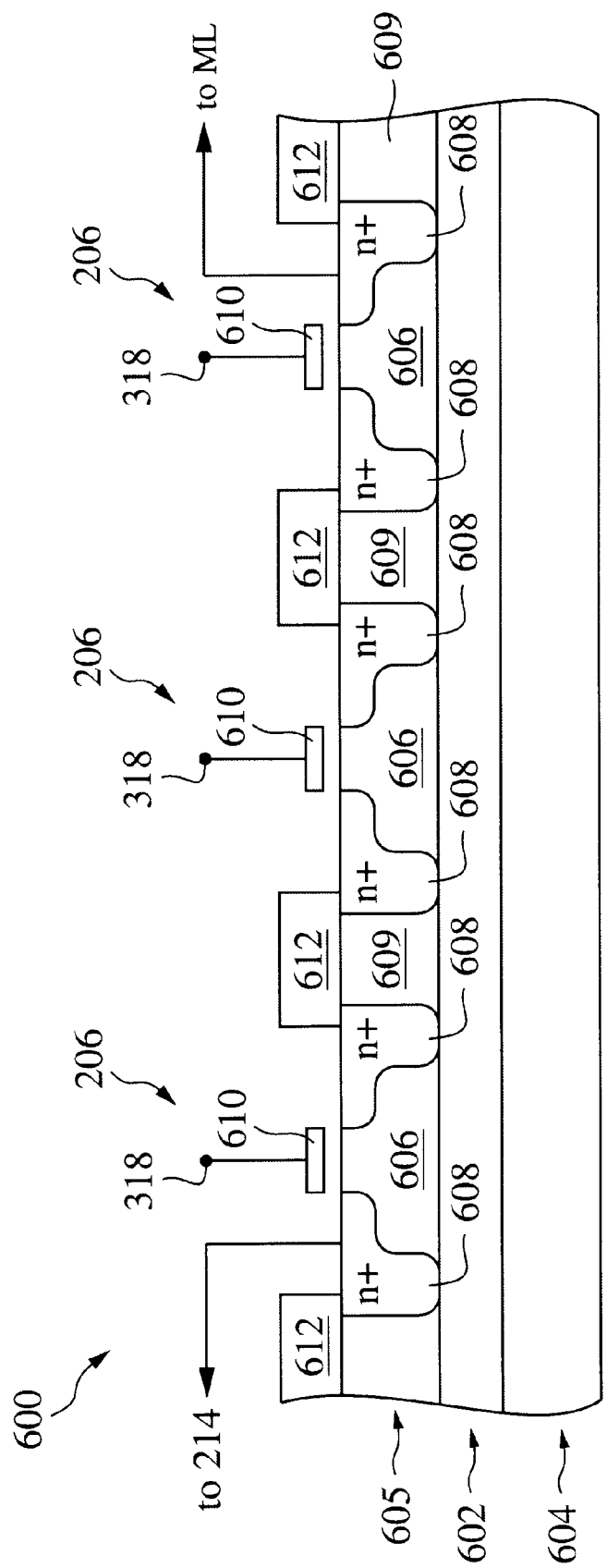
FIG. 6 illustrates one embodiment of a CAM row of FIG. 2 implemented in a silicon-on-insulator structure.

Applicant has found that embodiments of the present invention may advantageously be formed in a silicon-on-insulation (SIO) structure to further increase speed during compare operations. For example, FIG. 6 shows a portion of a NAND chain of match transistors 206 formed in an SOI structure 600. Structure 600 includes an insulation layer 602 interposed between a silicon substrate 604 and a second silicon layer 605. In one embodiment, insulating layer 602 is a buried oxide layer. N+ diffusion regions 608 are formed in active regions 606 of layer 605 in a well known manner and serve as source and drain regions for match transistors 206, each of which includes a polysilicon gate 610 coupled to the match node of a corresponding CAM cell (not shown in FIG. 6 for simplicity). Oxide regions 609 formed in layer 605 electrically isolate diffusion regions 608 of adjacent match transistors 206. Polysilicon regions 612 provide electrical connections between diffusion regions 608 of adjacent match transistors 206. Oxide regions 609, polysilicon gates 610, and polysilicon layer 612 are formed in a well-known manner.

In operation, the floating body voltage of structure 600 moves with the gate (610) voltage, and therefore eliminates the threshold voltage penalty typically associated with NAND transistor chains. Further, structure 600 exhibits less parasitic capacitances than bulk silicon structures, which in turn allows for reduced noise. Accordingly, implementing CAM structures of the present invention within an SOI structure, as shown in FIG. 6, allows for improved performance. In one embodiment, Applicant found during testing that a 64-bit CAM structure (e.g., CAM 500 of FIG. 5) implemented in an SOI structure as shown in FIG. 6 exhibited an access time of just 300 picoseconds.

I claim:

1. A content addressable memory (CAM) having at least one row, comprising:
 a first number of CAM cells each having a match node connected to a gate of a corresponding one of a first number of match transistors connected in series between a supply voltage and a first node;
 a second number of CAM cells each having a match node connected to a gate of a corresponding one of a second number of match transistors connected in series between the first node and a match line for the row; and
 a first boost circuit coupled to the first node, the boost circuit quickly charging the first node toward the supply voltage when the first node is charged beyond a threshold voltage during a match condition.

2. The CAM of claim 1, further comprising a second boost circuit coupled to the match line, the second boost circuit quickly charging the match line toward the supply voltage when the match line is charged beyond the threshold voltage during the match condition.

3. The CAM of claim 2, wherein the first and second boost circuits each include a control terminal coupled to receive a mode signal, the first and second boost circuits selectively discharging the match line in response to the mode signal.

4. The CAM of claim 3, wherein the first and second boost circuits each comprise:
 a first transistor having a first terminal connected to the voltage supply, a second terminal connected to a second node, and a gate connected to the match line;
 a second transistor having a first terminal connected to the second node, a second terminal connected to ground potential, and a gate connected to the match line;
 a third transistor having a first terminal connected to the voltage supply, a second terminal connected to the match line, and a gate connected to the second node; and
 a fourth transistor having a first terminal connected to the match line, a second terminal connected to ground potential, and a gate connected to receive the mode signal.

5. The CAM of claim 4, further comprising an evaluate transistor connected between the first number of CAM cells and the supply voltage, and having a gate coupled to receive an evaluate signal.

6. The CAM of claim 4, wherein the CAM is formed in a silicon-on-insulator structure.

7. A content addressable memory (CAM) having at least one row, comprising:
 a plurality of first match transistors connected in series between a supply voltage and a match line;
 a plurality of first CAM cells each having a match node coupled to a gate of a corresponding first match transistor; and
 a first boost circuit coupled to the match line, the first boost circuit quickly charging the match line toward the supply voltage if all the first CAM cells indicate a match.

8. The CAM of claim 7, wherein the first boost circuit turns on to charge the match line toward the supply voltage when the match line voltage reaches a threshold voltage.

9. The CAM of claim 8, further comprising:
 a plurality of second match transistors connected in series between the match transistors and the match line;
 a plurality of second CAM cells each having a match node coupled to a gate of a corresponding second match transistor; and
 a second boost circuit coupled to the match line, the second boost circuit quickly charging the match line toward the supply voltage if all the second CAM cells indicate a match.

10. The CAM of claim 9, wherein the first and second boost circuits each include a control terminal coupled to receive a mode signal, the first and second boost circuits selectively discharging the match line in response to the mode signal.

11. The CAM of claim 10, wherein the first and second boost circuits each comprise:
 a first transistor having a first terminal connected to the voltage supply, a second terminal connected to a second node, and a gate connected to the match line;
 a second transistor having a first terminal connected to the second node, a second terminal connected to ground potential, and a gate connected to the match line;
 a third transistor having a first terminal connected to the voltage supply, a second terminal connected to the match line, and a gate connected to the second node; and
 a fourth transistor having a first terminal connected to the match line, a second terminal connected to ground potential, and a gate connected to receive the mode signal.

12. The CAM of claim 11, further comprising an evaluate transistor connected between the first CAM cells and the supply voltage, and having a gate coupled to receive an evaluate signal.

13. The CAM of claim 11, wherein the CAM is formed in a silicon-on-insulator structure.

* * * * *